(12) United States Patent
Pearse et al.

(10) Patent No.: US 8,304,314 B2
(45) Date of Patent: Nov. 6, 2012

(54) METHOD OF FORMING AN MOS TRANSISTOR

(75) Inventors: Jeffrey Pearse, Chandler, AZ (US);
Prasad Venkatraman, Gilbert, AZ (US);
James Sellers, Chandler, AZ (US);
Hemanshu D. Bhatt, Bangalore (IN)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1078 days.

(21) Appl. No.: 12/236,718

(22) Filed: Sep. 24, 2008

(65) Prior Publication Data

US 2010/0072544 A1  Mar. 25, 2010

(51) Int. Cl.
*H01L 21/336* (2006.01)

(52) U.S. Cl. ........ 438/270; 438/478; 438/524; 438/589; 438/E29.262

(58) Field of Classification Search .................. 438/197, 438/270; 257/328–334
See application file for complete search history.

(56) References Cited

U.S. PATENT DOCUMENTS

| | | | |
|---|---|---|---|
| 5,998,833 A | 12/1999 | Baliga | |
| 6,388,286 B1 | 5/2002 | Baliga | |
| 6,621,121 B2 | 9/2003 | Baliga | |
| 6,764,889 B2 | 7/2004 | Baliga | |
| 2009/0090967 A1* | 4/2009 | Chen et al. | 257/330 |
| 2010/0123193 A1* | 5/2010 | Burke et al. | 257/334 |
| 2011/0291185 A1* | 12/2011 | Grover | 257/334 |

* cited by examiner

*Primary Examiner* — Dung A. Le
(74) *Attorney, Agent, or Firm* — Robert F. Hightower

(57) ABSTRACT

In one embodiment, a method of forming an MOS transistor includes forming the MOS transistor to have an active region and a termination region. Within the termination region the method includes forming a plurality of trenches having a conductor within the plurality of trenches. The method also includes forming another conductor to make electrical contact to one of the conductors within the plurality of trenches.

15 Claims, 18 Drawing Sheets

METHOD OF FORMING AN MOS TRANSISTOR

BACKGROUND OF THE INVENTION

The present invention relates, in general, to electronics, and more particularly, to methods of forming semiconductor devices and structure.

In the past, the semiconductor industry utilized various different device structures and methods to form metal oxide semiconductor (MOS) transistors. One particular structure for a vertical power MOS transistor utilized trenches that were formed in an active area of the transistor. A portion of those trenches were utilized as the gate regions of the transistor. Some of these transistors also had a shield conductor that assisted in lowering the gate-to-drain capacitance of the transistor. Another portion of the transistor that was external to the active area was often referred to as a termination area of the transistor. Generally, two different conductors were formed in the termination region in order to make electrical contact to the gate and shield electrodes of the transistor. These two conductors generally were formed overlying each other as a two conductor stack on the surface of the substrate within the termination area. However, such structures generally had a high stack height which made them difficult to reliably manufacture and had a high manufacturing cost.

Accordingly, it is desirable to have a device structure and a process for forming the device structure that results in better process control and lower costs, and that results in a lower resistance for the gate and shield conductors.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. The use of the word approximately or substantially means that a value of an element has a parameter that is expected to be very close to a stated value or position or state. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description may illustrate a cellular design (where the body regions are a plurality of cellular regions) or a single body design (where the body region is comprised of a single region formed in an elongated pattern, typically in a serpentine pattern or formed in a plurality of stripes). However, it is intended that the description is applicable to both a cellular implementation and a single base implementation.

DETAILED DESCRIPTION OF THE DRAWINGS

Figure 1:
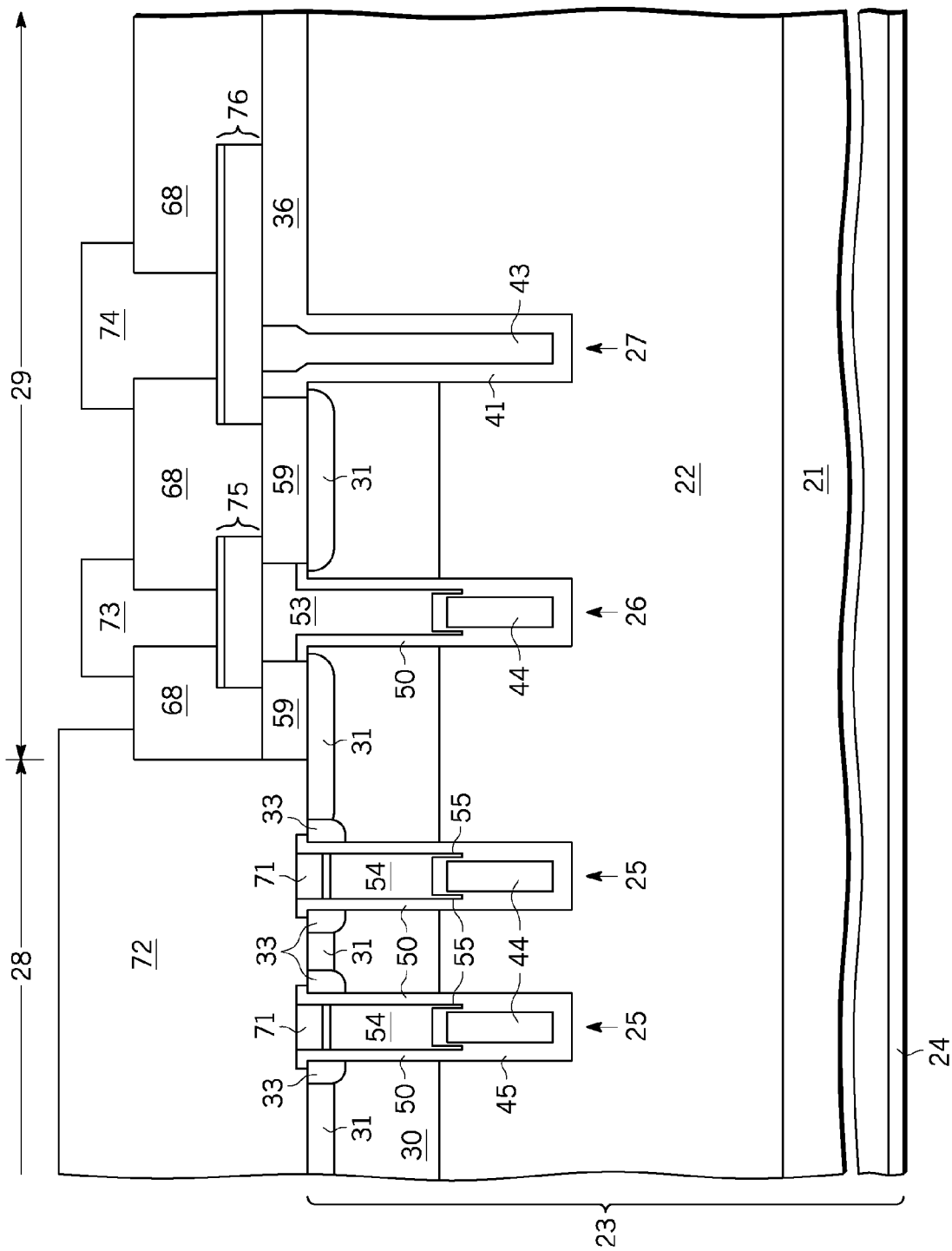
FIG. 1 illustrates an enlarged cross-sectional portion of an embodiment of an MOS transistor in accordance with the present invention.

FIG. 1 illustrates an enlarged cross-sectional portion of an embodiment of an MOS transistor 20 that is formed according to a process that provides improved process control and that is easier to manufacture thereby resulting in a lower cost. Transistor 20 is formed on a semiconductor substrate 23. In the preferred embodiment, substrate 23 includes a bulk semiconductor or bulk substrate 21 that has an epitaxial layer 22 formed on one surface of bulk substrate 21. Transistor 20 is configured to have an active region 28 where source and gate regions are formed to control current flow through transistor 20. A source electrode 72 provides electrical connection to the source regions of transistor 20. A termination region 29 of transistor 20 is configured to reduce the intensity of the electric fields formed during the operation of transistor 20 in order to inhibit premature breakdown in the termination region and provide an improved breakdown voltage for transistor 20. Active region 28 includes a plurality of active trenches 25 that assist in controlling the current flow vertically through transistor 20 to a drain electrode 24. As will be seen further hereinafter, the plurality of active trenches 25 include a shield conductor 44 that is formed within each of the plurality of trenches 25. Each of trenches 25 also includes a gate conductor 54. Within each of trenches 25, gate conductor 54 overlies but is electrically isolated from shield conductor 44. A shield contact trench 27 is formed within termination region 29 to facilitate forming electrical contact to shield conductors 44. Also, a gate contact trench 26 is formed within termination region 29 to facilitate forming electrical contact to gate conductors 54. As will be seen further in the description of FIG. 2, the preferred embodiment of transistor 20 includes a plurality of trenches 26 and a plurality of trenches 27. A gate conductor 75 and a shield conductor 76 are formed to overlie and form electrical contact to conductor portions of respective trenches 26 and 27. As will be seen further hereinafter, conductors 75 and 76 are formed to reduce the step height in the termination region which improves the manufacturability of transistor 20 and lowers the manufacturing costs.

Figure 2:
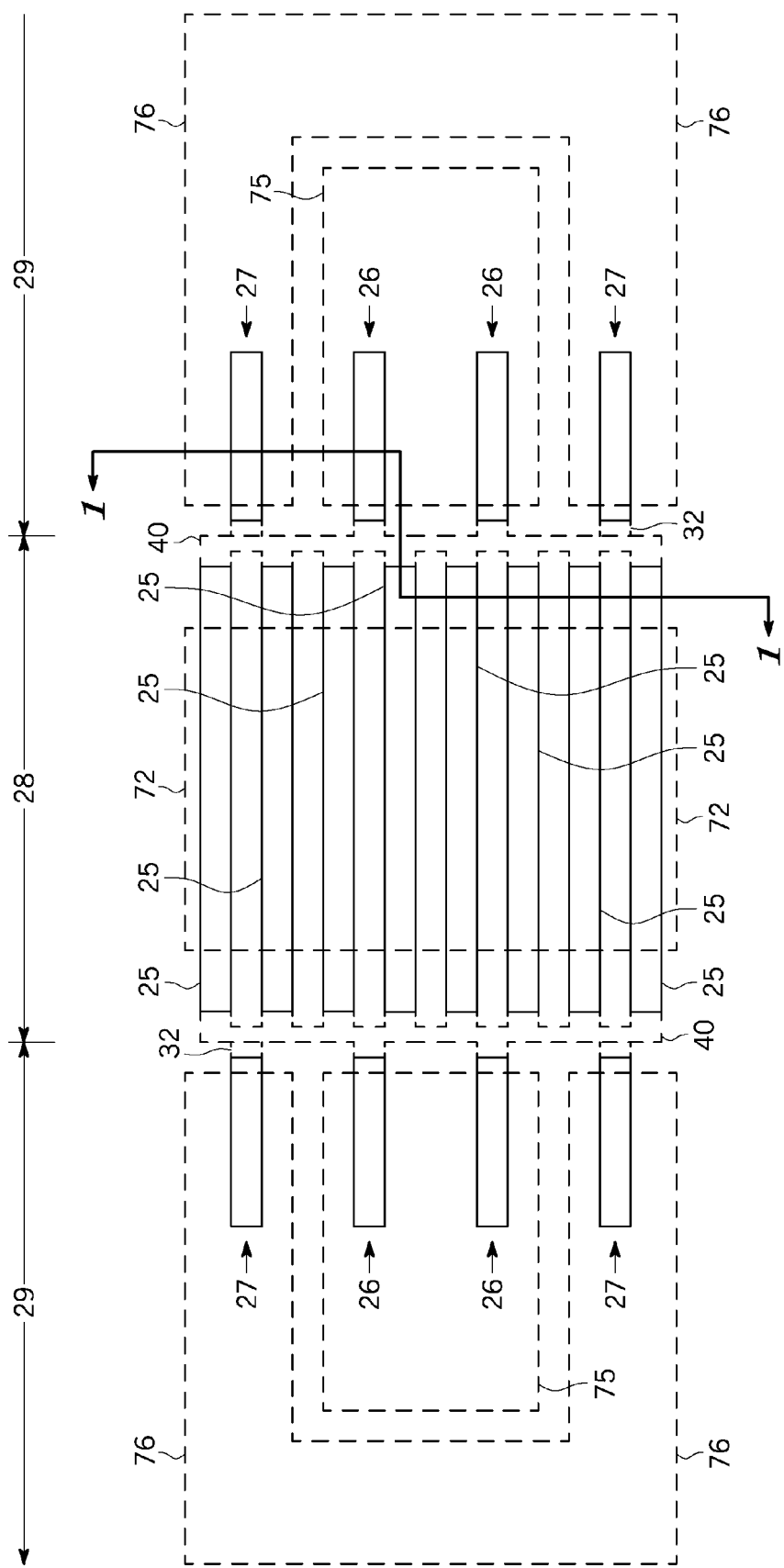
FIG. 2 illustrates an enlarged plan view of a portion of an embodiment of the transistor of FIG. 1 in accordance with the present invention.

FIG. 2 illustrates an enlarged plan view of a portion of an embodiment of transistor 20 prior to forming source electrode 72. Thus, source electrode 72, gate conductor 75 and shield conductor 76 are illustrated by dashed lines. Cross-section lines 1-1 illustrate the cross-section used for the view illustrated in FIG. 1. Plurality of active trenches 25 are illustrated in active region 28. Plurality of shield contact trenches 27 are formed in substrate 23 within termination region 29. Plurality of gate contact trenches 26 are formed in substrate 23 and positioned in termination region 29 near shield contact trenches 27 and active trenches 25.

Figure 3:
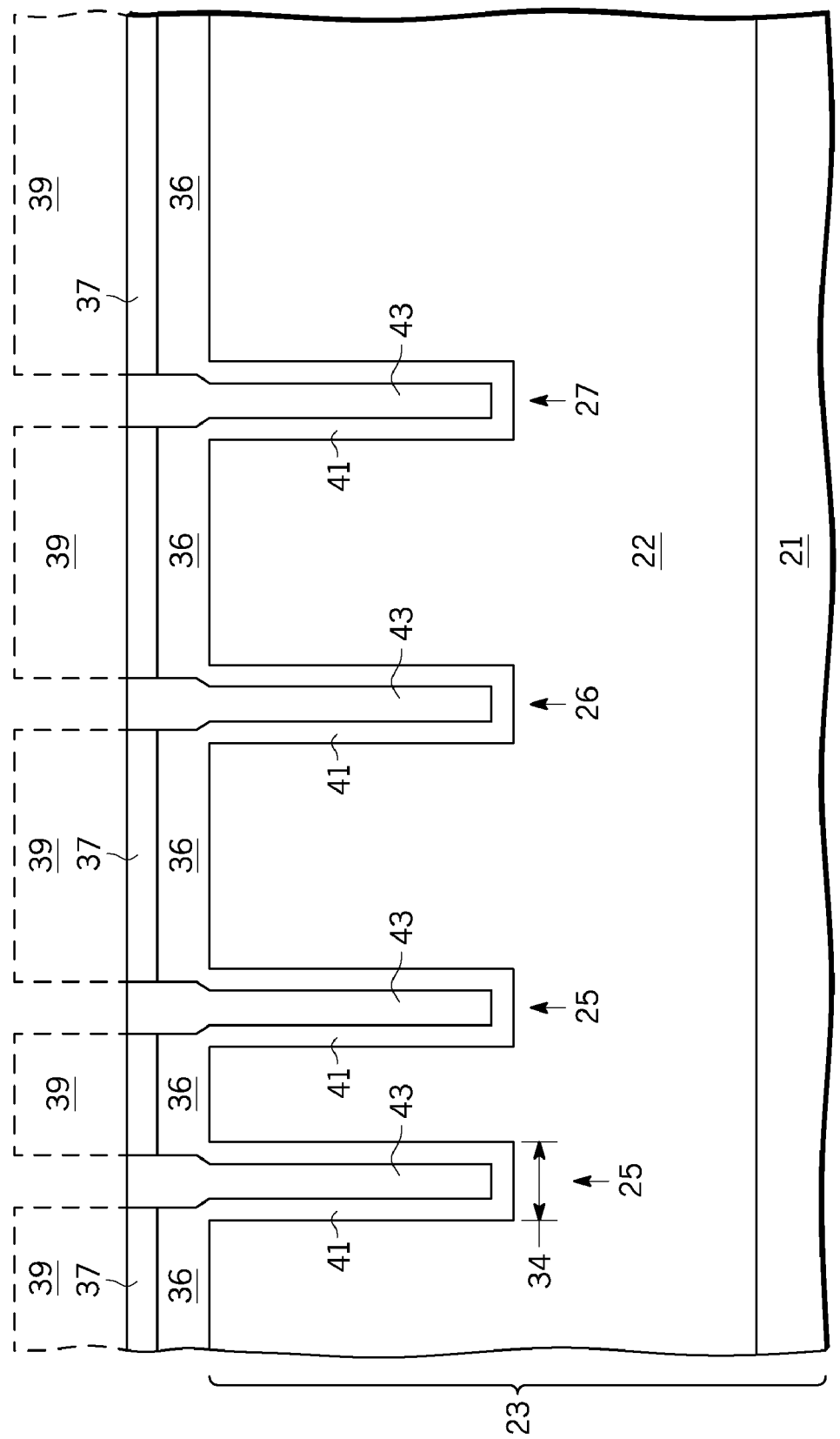
FIG. 3-FIG. 12 illustrate enlarged cross-sectional portions of the transistor of FIG. 1 illustrating various stages according to an embodiment of one method of forming the transistor of FIG. 1 and FIG. 2 in accordance with the present invention.

FIG. 3 illustrates an enlarged cross-sectional view of substrate 23 at an early stage in the manufacturing of transistor 20. Preferably, bulk substrate 21 is a highly doped N-type silicon substrate on which a lower doped N-type epitaxial layer 22 is formed. In some embodiments, layer 22 may be formed from multiple layers, may have a graded or stepwise graded doping profile, or may even be omitted. A silicon dioxide layer (oxide) 36 is formed on a top or first surface of substrate 23 and a silicon nitride layer 37 is formed on oxide 36. The combination of oxide 36 and nitride layer 37 are used as a mask that assists in forming the opening for trenches 25, 26, and 27. In some embodiments, a thick oxide layer may be used instead of the combination of oxide 36 and silicon nitride layer 37. A mask 39 (illustrated by dashed lines) is formed on layer 37 and patterned to have openings where trenches 25, 26, and 27 are to be formed. Thereafter, openings are formed through layer 37 and oxide 36 into substrate 23 to form trench openings into substrate 23. Subsequently, an insulator is formed on the sidewalls and bottom of the trench openings to form a trench insulator 41 along the sidewalls and bottom of the trench openings. Mask 39 typically is removed prior to the step of forming insulator 41. Insulator 41 may be formed by a variety of well-known techniques including growing or depositing an insulator material or combination of insulator materials. Insulator 41 preferably is formed by oxidizing the material of the sidewalls and bottom to form a silicon dioxide insulator; however, the material used for insulator 41 could be a variety of well-known insulator materials including silicon oxynitride, TEOS, or other high dielectric constant materials. Generally, the thickness of trench insulator 41 forms an opening within the trench openings that is less than the width of the opening that was formed through nitride layer 37.

Subsequently, a conductor 43 is formed within the remainder of the openings of trenches 25. In the preferred embodiment, conductor 43 is formed as a doped polysilicon material within the remainder of the trench openings that were formed for trenches 25, 26, and 27. The top surface is planarized down to the surface of layer 22 to remove any of the conductor material therefrom and leave a substantially planar surface. For example, the material used to form conductor 43 may be etched with a blanket etch in order to remove the conductor material. Alternately, a chemical mechanical polishing (CMP) procedure may be utilized.

Figure 4:
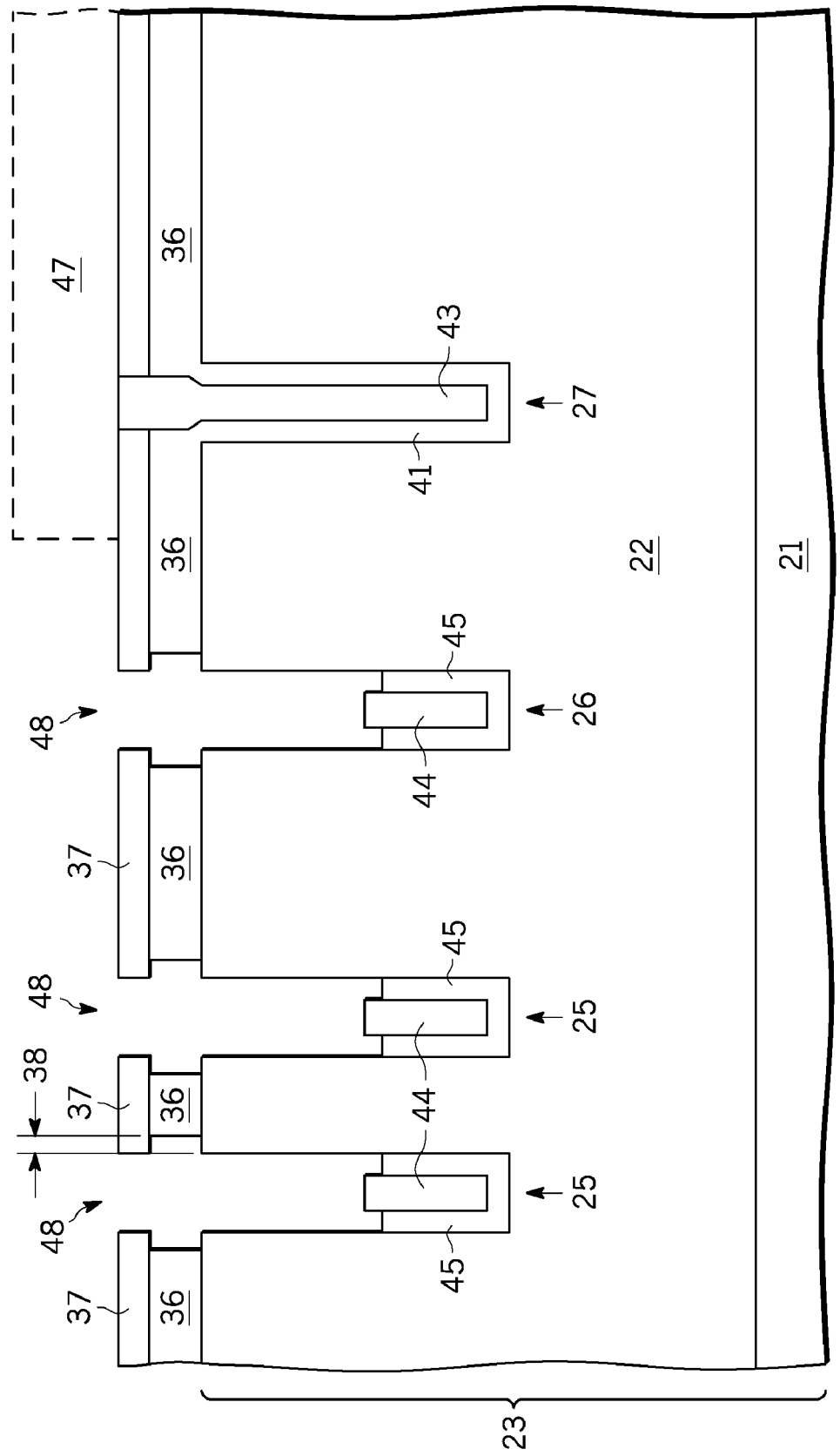

FIG. 4 illustrates a subsequent step in the formation of transistor 20. A mask 47 (illustrated by dashed lines) is formed to overlie and protect shield contact trench 27 and expose trenches 25 and 26. A portion of conductor 43 is removed from within trenches 25 and 26 to leave a portion of conductor 43 within the lower portion of the openings of trenches 25 and 26 as shield conductor 44. Subsequently, mask 47 may be removed. Additionally, a portion of trench insulator 41 is removed from the sidewalls of the trench openings. During this operation, a portion of insulator 41 is also removed from the sidewalls, around the top corners, and along the sidewalls adjacent to conductor 44. This portion of insulator 41 usually is removed to a depth below the top of conductor 44 that is approximately the same as the thickness of insulator 41. The portion of insulator 41 that is left forms a shield insulator 45 within the lower portion of trenches 25 and 26. Insulator 41 typically is removed to a distance that is no less than and preferably is greater than a depth where the channel of transistor 20 will be formed during the operation of transistor 20. In one example embodiment of a transistor having a breakdown voltage of about thirty volts (30V), conductor 43 was first formed to extend to a depth of approximately two (2) microns and a portion of conductor 43 was removed to leave approximately 0.8 microns of conductor 43 in the bottom of trenches 25 and 26 as conductor 44. In this example embodiment, portions of insulator 41 are removed leaving the upper surface of insulator 45 to be position at least about one (1) micron away from the surface of substrate 23 and to extend along the bottom and a portion of the sidewalls of trenches 25 and 26.

The process of removing a portion of insulator 41 also etches the exposed sidewalls of layer 36 so that the sidewalls of layer 36 are spaced a distance 38 from the openings of trenches 25 and 26. As will be seen hereinafter, distance 38 assists in self-aligning the sources, the body, and the source electrodes of transistor 20.

Figure 5:
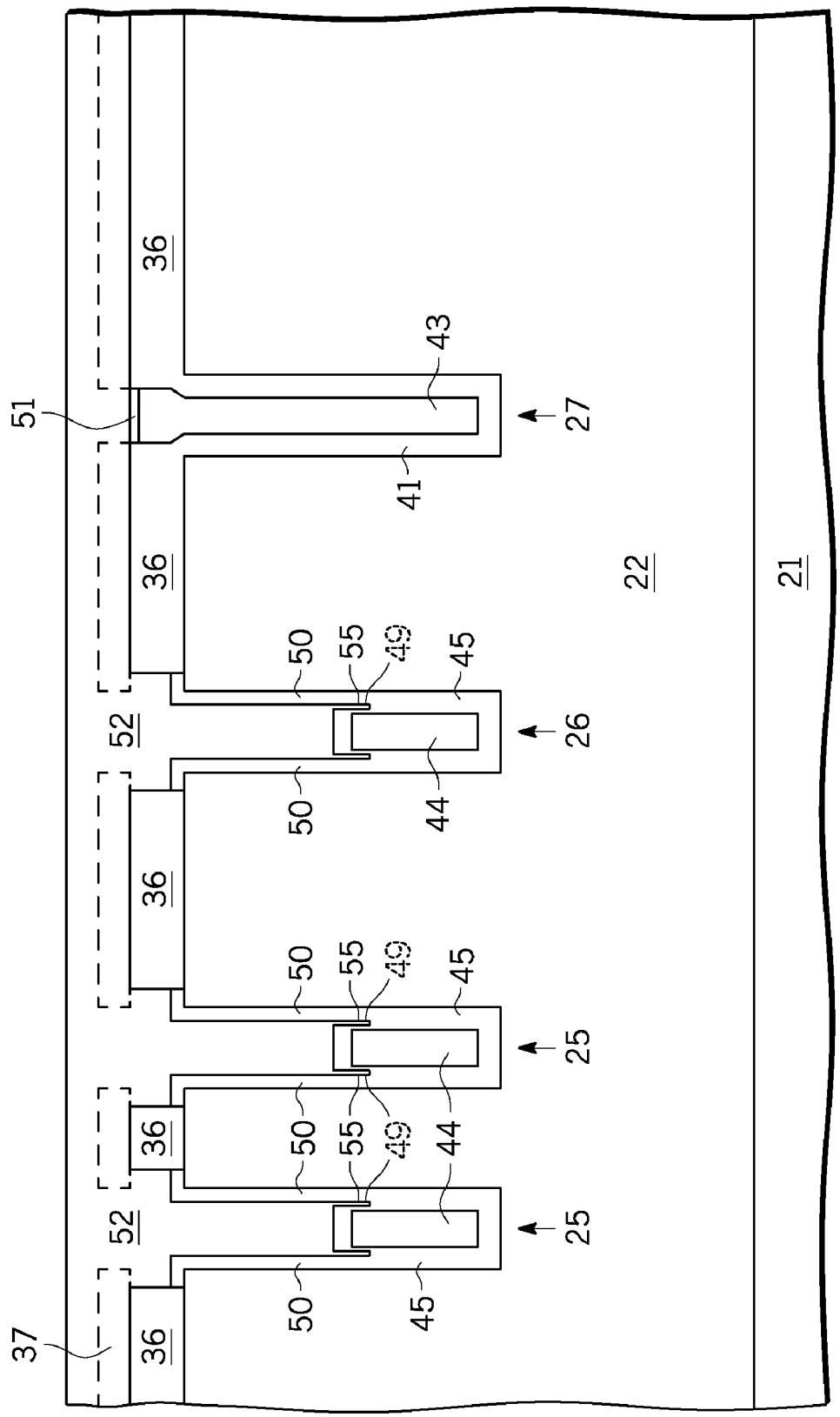

Referring to FIG. 5, at a subsequent processing step layer 37 is removed (dashed lines illustrate the removed layer 37). Subsequently, a gate insulator 50 is formed along the exposed sidewalls of trenches 25 and 26 and to extend up onto the portion of the surface of substrate 23 that is exposed by the opening through oxide 36. During the formation of gate insulator 50 along the sidewalls, a portion of gate insulator 50 is formed to cover the exposed portions of conductor 44 thereby forming an insulator completely around conductor 44. In the preferred embodiment, the sidewalls of the openings, the exposed portion of conductor 44, and the exposed surface of substrate 23 are oxidized to form insulator 50. However, the thickness of insulator 50 usually is less than the thickness of insulator 41 that was previously removed, thus, the openings of trenches 25 and 26 generally extend a distance past the upper surface of conductor 44 to form auxiliary openings 49 that extend parallel to conductors 44 and that are positioned between the portion of insulator 50 that is on the sidewalls and the portion of insulator 50 that is on conductor 44. Because auxiliary openings 49 are subsequently filled, in this view of transistor 20 the reference numbers are illustrated in dashed lines. A conductor 52 is formed by forming another conductor material to fill the remainder of the openings of trenches 25 and 26 and to extend onto the surface of oxide 36. In the preferred embodiment, insulator 50 is formed to a thickness of about one hundred to one thousand (100-1000) and preferably about five hundred (500) Angstroms. Also in this preferred embodiment, conductor 52 is formed by blanket depositing a layer of doped polysilicon in active region 28 and termination region 29; however, the material of conductor 52 may also be a silicide or a metal. A portion of conductor 52 fills opening 49 to form a portion of conductor 52 extending between conductor 44 and the sidewall of trenches 25 and 26 as a conductor extension 55.

The surface is again planarized down to the surface of oxide 36 to remove the portion of the conductor material on oxide 36 and form a substantially planar surface. For example, a dry etch or CMP operation may be utilized to perform the planarization. After the planarization operation, a portion of insulator 50 may remain above conductor 43 in trench 27 as an insulator 51 although the planarization process may remove portions of oxide 36 in order to also remove this portion of insulator 51.

Figure 6:
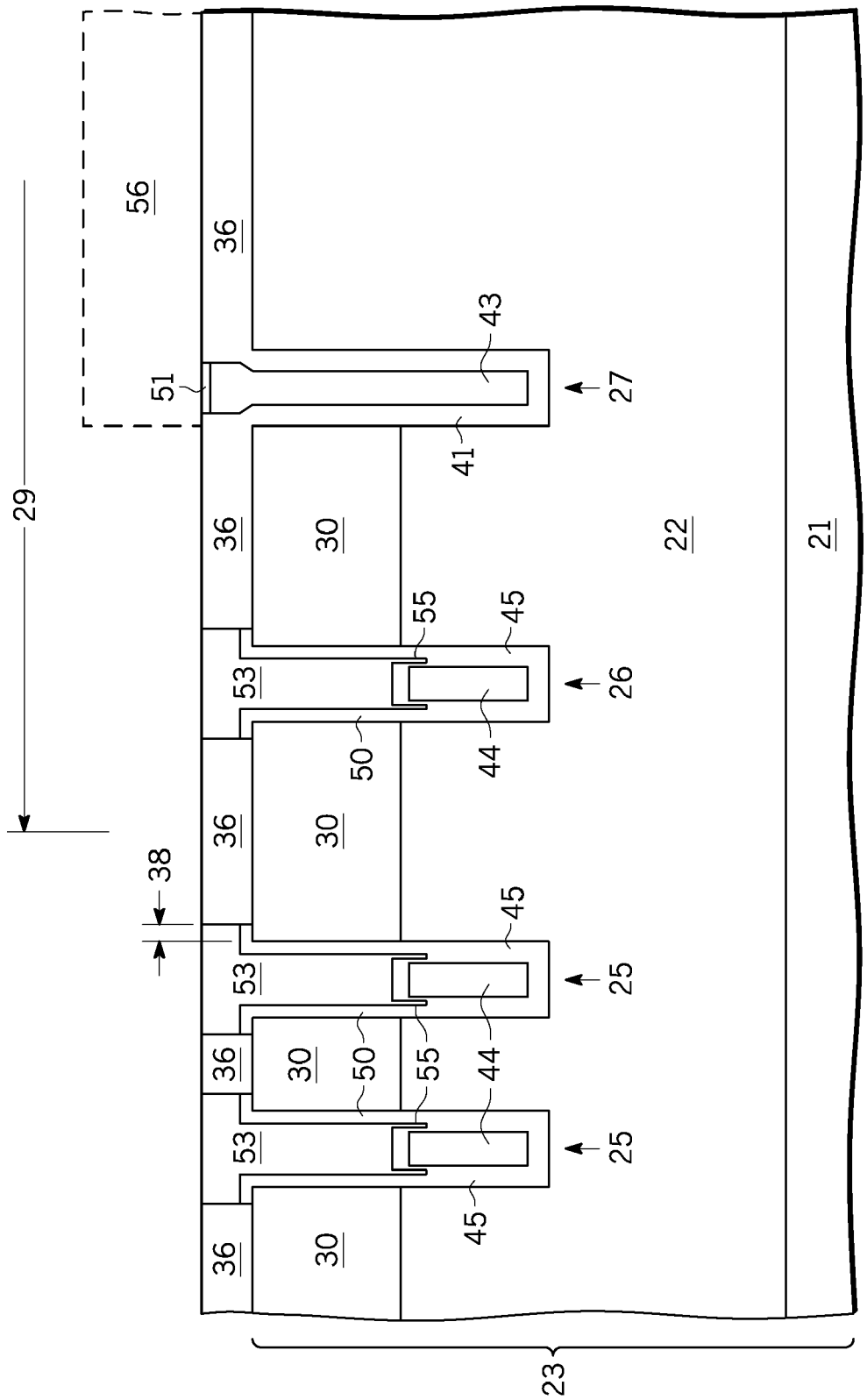

FIG. 6 illustrates transistor 20 following subsequent processing steps. Because oxide 36 was previously undercut by distance 38, a portion of conductor 52 extends to overlie the surface of substrate 23 by an amount that is approximately equal to distance 38 thereby forming conductors 53 with a T-shape wherein the cross-bar of the T-shape is the portion of conductor 53 overlying substrate 23. As will be seen further hereinafter, the T-shape assists in self-aligning the source, body, and source electrodes to the outer sidewalls of the gate structure of transistor 20. This planarization step also assists in forming a substantially planar surface in region 29. Subsequently, a mask 56 (illustrated by dashed lines) may be formed to cover and protect trench 27 while exposing active region 28 in addition to the portion of termination region 29 that includes trench 26 and the region between trench 26 and trench 27. A doped region 30 is formed on the surface of and extending into substrate 23 in the region exposed by mask 56. Region 30 generally is a doped region having a conductivity that is the opposite of the conductivity of layer 22. A P-N junction is formed at the interface of region 30 and layer 22. During the operation of transistor 20, region 30 facilitates forming a channel region along the portion of region 30 that is near the outer sidewall of trenches 25 and 26 and opposite to conductors 53 and 54 (FIG. 1). Region 30 preferably is formed to extend a depth from the surface of substrate 23 such that the P-N junction is positioned near the bottom of extensions 55. Extensions 55 of conductor 53 surround an upper portion of conductor 44. If region 30, thus the P-N junction, extends past the upper surface of conductor 44 (such as by variations in process parameters), extensions 55 facilitate forming the channel region continuously through the depth of region 30. Laterally, region 30 generally extends to abut insulator 41 of trench 26. Region 30 is often referred to as a body region of transistor 20. Mask 56 is subsequently removed, and region 30 is annealed.

Figure 7:
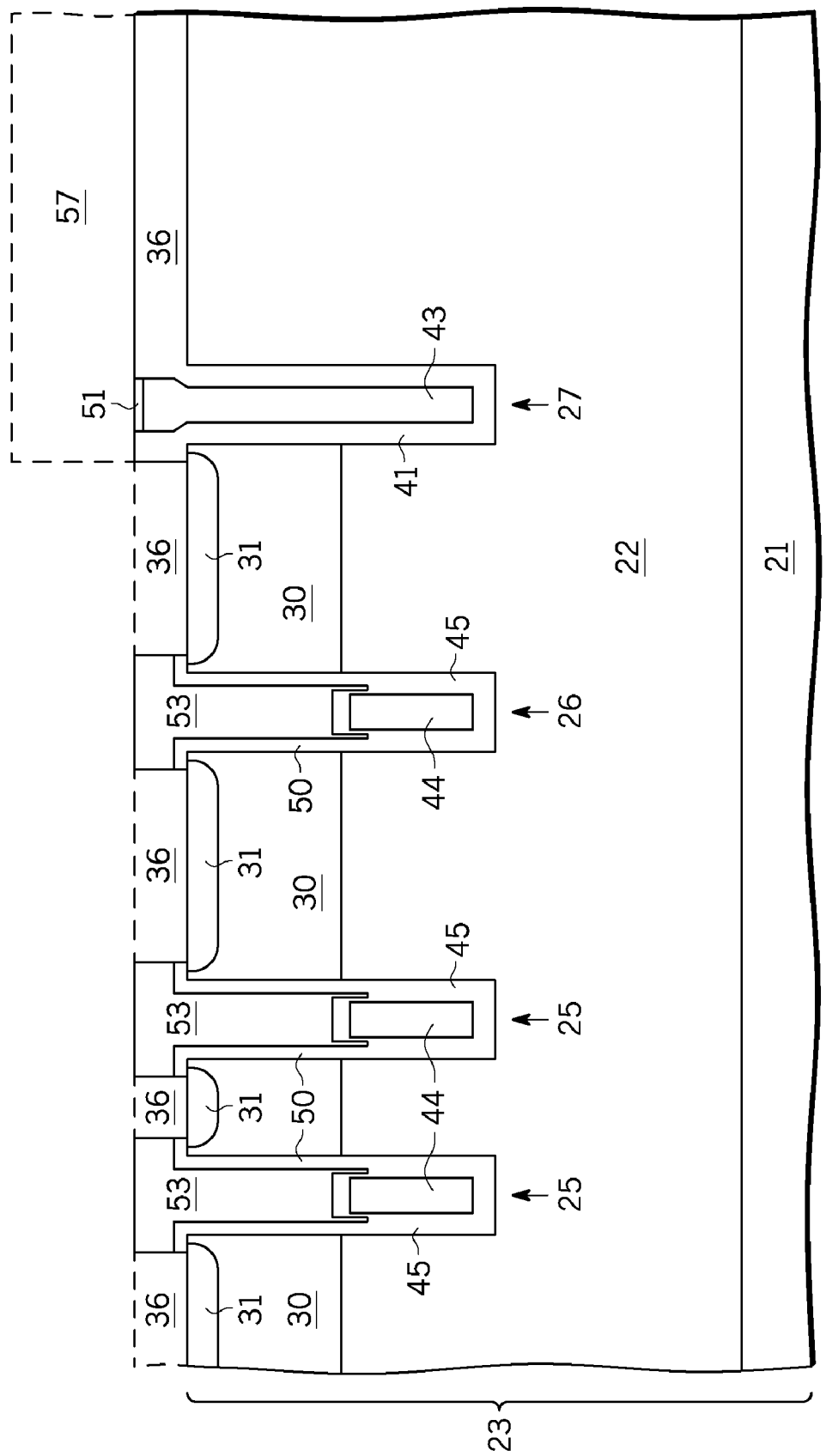

Referring to FIG. 7, during subsequent processing operations, another mask 57 (illustrated by dashed lines) that is substantially the same as mask 56 is applied. It should be noted, that the previous annealing step could be postponed and mask 56 could be used instead of mask 57. Portions of oxide 36 that are exposed between trenches 25 and trenches 26, and between trenches 26 and 27 are removed to expose portions of region 30 on the surface of substrate 23. The removed portions of oxide 36 are illustrated by dashed lines. A wet etch or a reactive ion etch (RIE) may be used for this operation. Doped regions 31 are formed through the openings between conductors 53 so that regions 31 are formed on the surface of and extending into substrate 23 and within region 30. The cross-bar of the T-shape of conductors 53 masks a portion of the surface of substrate 23 so that regions 31 are spaced a distance away from the outer sidewalls of insulator 50, thus, the outer sidewalls of the gate structures formed by trenches 25 and 26. Consequently, regions 31 are formed self-aligned to trenches 25 and 26. Doped regions 31 generally are formed by implanting dopants that are the same conductivity as region 30 but with a higher doping concentration. Regions 31 subsequently may be used to form the body contact region of transistor 20. Mask 57 typically is removed and regions 31 are annealed.

Figure 8:
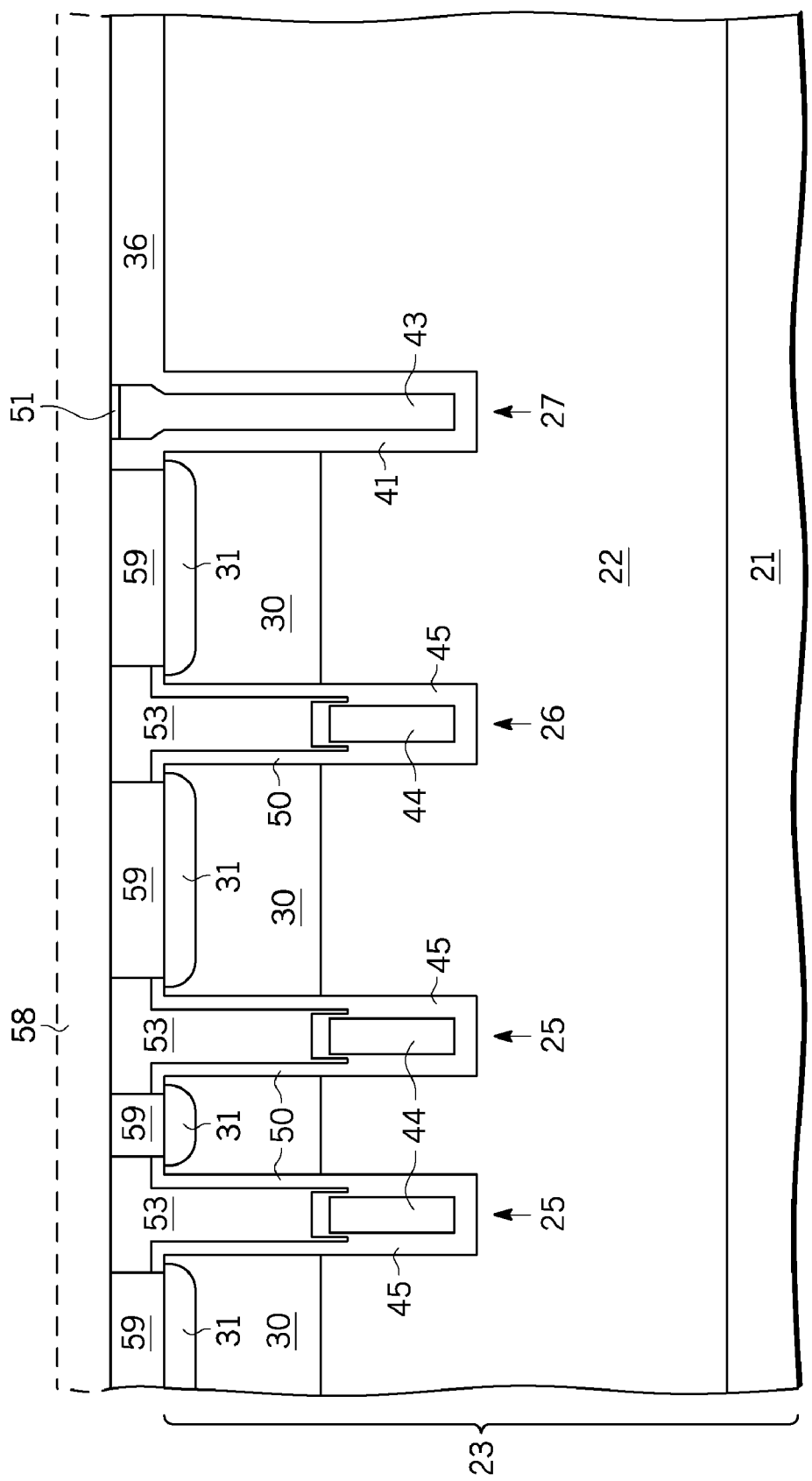

Referring to FIG. 8, a selective etch layer 58 (illustrated by dashed lines) is subsequently applied to fill the openings between trenches 25, 26, and 27 and cover the surface of active region 28 including the surface of oxide 36 in termination region 29. The material utilized for selective etch layer 58 is a material that is not etched by the compounds used for etching conductor 53. In the preferred embodiment, conductor 53 is doped polysilicon and the material used for layer 58 is silicon nitride. The surface of transistor 20 is again planarized by removing portions of layer 58 down to the level of oxide 36 thereby leaving portions of layer 58 as selective etch portions 59 that are substantially planar to oxide 36 and to conductors 53. Layer 58 may be planarized utilizing a CMP operation or by other operations such as wet etching. The planar surface facilitates more reliably forming subsequent portions of transistor 20.

Figure 9:
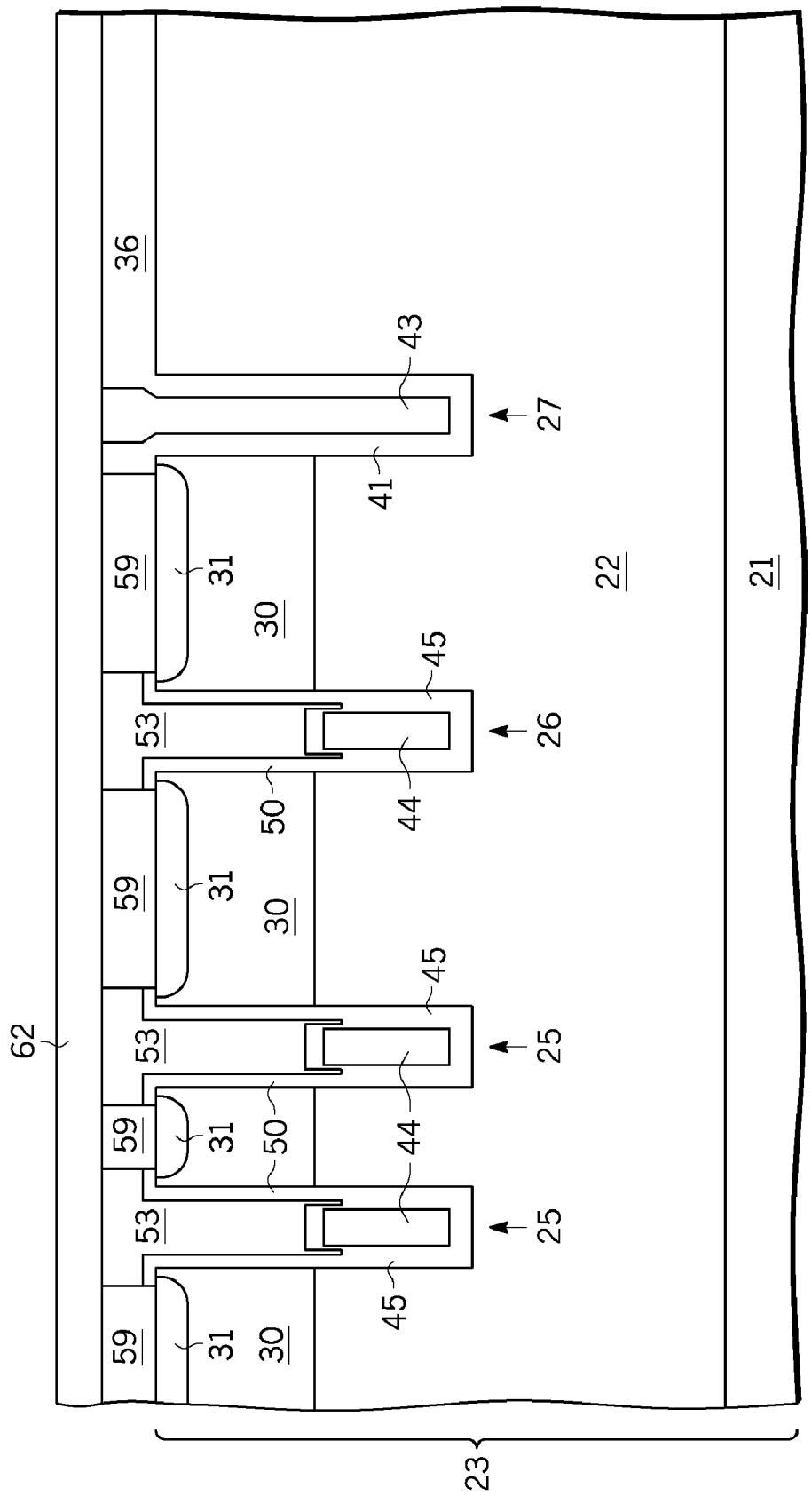

FIG. 9 illustrates transistor 20 after forming a conductor 62 on the trenches in active region 28 and termination region 29. Conductor 62 is formed to make electrical contact to conductor 43 that is within trench 27 and to conductor 53 that is within trench 26. Conductor 62 may also make electrical contact to conductor 53 within trench 25, but this portion of conductor 62 usually is subsequently removed. Prior to forming conductor 62, any remaining portions of insulator 51 that overlies conductor 43 is removed to facilitate forming electrical connections to conductor 43. In the preferred embodiment, conductor 62 is formed by applying a blanket layer of doped polysilicon. In some embodiments, tungsten silicide or tungsten, or other alloys thereof, may be used instead of the polysilicon.

Figure 10:
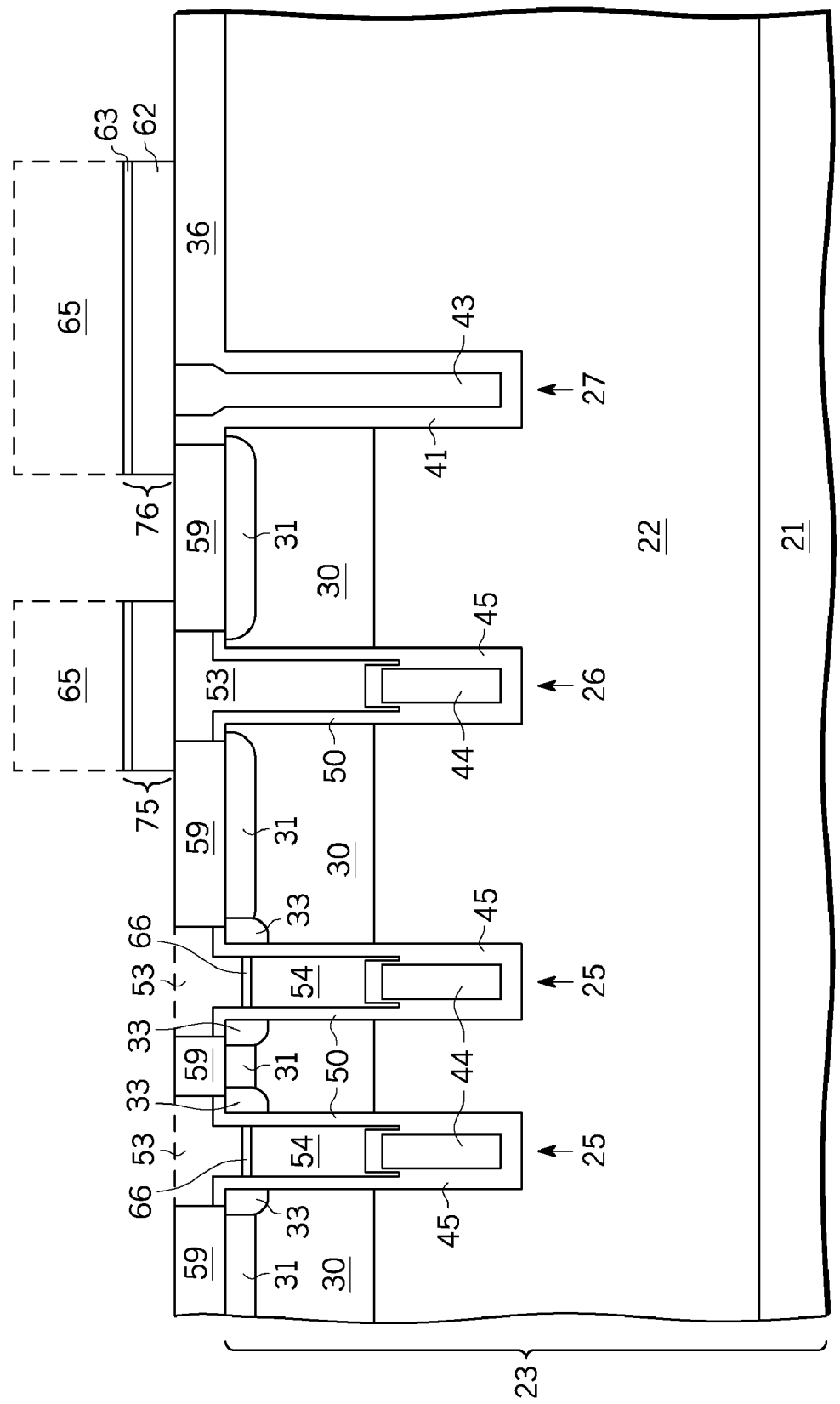

Referring to FIG. 10, a mask 65 (illustrated by dashed lines) is thereafter applied and patterned to form openings overlying active region 28 and the portion of regions 31 within termination region 29 where it is desired to form electrical connections to regions 31. In region 29, the openings are usually formed to not overlie conductors 43 and 53 or any other portions of trenches 26 and 27. The exposed portions of conductor 53 within trenches 25 are removed and further portions of conductor 53 are removed (as illustrated by dashed lines) so that the top surface of the remaining portion of conductors 53 is below the top surface of substrate 23 thereby leaving conductor 54 within trenches 25 overlying conductor 44 but not electrically connected to conductor 44. This operation generally exposes the upper surface of insulator 50 that was formed on the surface of substrate 23. In the preferred embodiment conductor 54 is doped polysilicon and selective etch portions 59 are silicon nitride, thus, a dry etch can be utilized to remove the portions of conductor 54 without affecting portions 59 or underlying portions of transistor 20. In some embodiments, tungsten silicide or tungsten, or other alloys thereof, may be used instead of the polysilicon.

Mask 65 is utilized to pattern conductor 62 and leave a gate conductor 75 overlying and electrically contacting the portion of conductor 53 that is within trench 26 and a shield conductor 76 overlying and electrically contacting conductor 43 that is within trench 27. In the preferred embodiment conductor 62 is doped polysilicon, thus, the operation used to remove the portions of conductor 53 will also perform the patterning of conductor 62. Additionally, mask 65 may be removed and the polysilicon of the preferred embodiment of conductors 75, 76, and 54 may be silicided at this particular step in order to reduce the resistivity of the conductors. The silicided portions of conductors 62 and 54 are illustrated as respective silicide regions 63 and 66. As illustrated in FIG. 2 conductors 75 and 76 are inter-digitated or interleaved between each other in order to keep conductors 75 and 76 substantially co-planar and to prevent having to cross one over the other.

Thereafter, selective etch portions 59 are utilized as a mask for forming doped regions 33 on the surface of and extending into substrate 23 to form source regions of transistor 20. Regions 33 generally abut or overlap regions 31. In the preferred embodiment, regions 33 are formed as N-type conductivity. Using portions 59 as a mask forms regions 33 self-aligned to the gate structure formed by trenches 25 and to regions 31. In addition, using portions 59 as a mask avoids having to apply a critical mask and the associated processing steps. Regions 33 generally are annealed to activate the dopants. Keeping conductor 53 within trench 26 and not making contact thereto until after forming the active portions of transistor 20, further facilitates keeping the surface in region 29 planar thereby improving the manufacturability of the method and reducing the cost of transistor 20.

Figure 11:
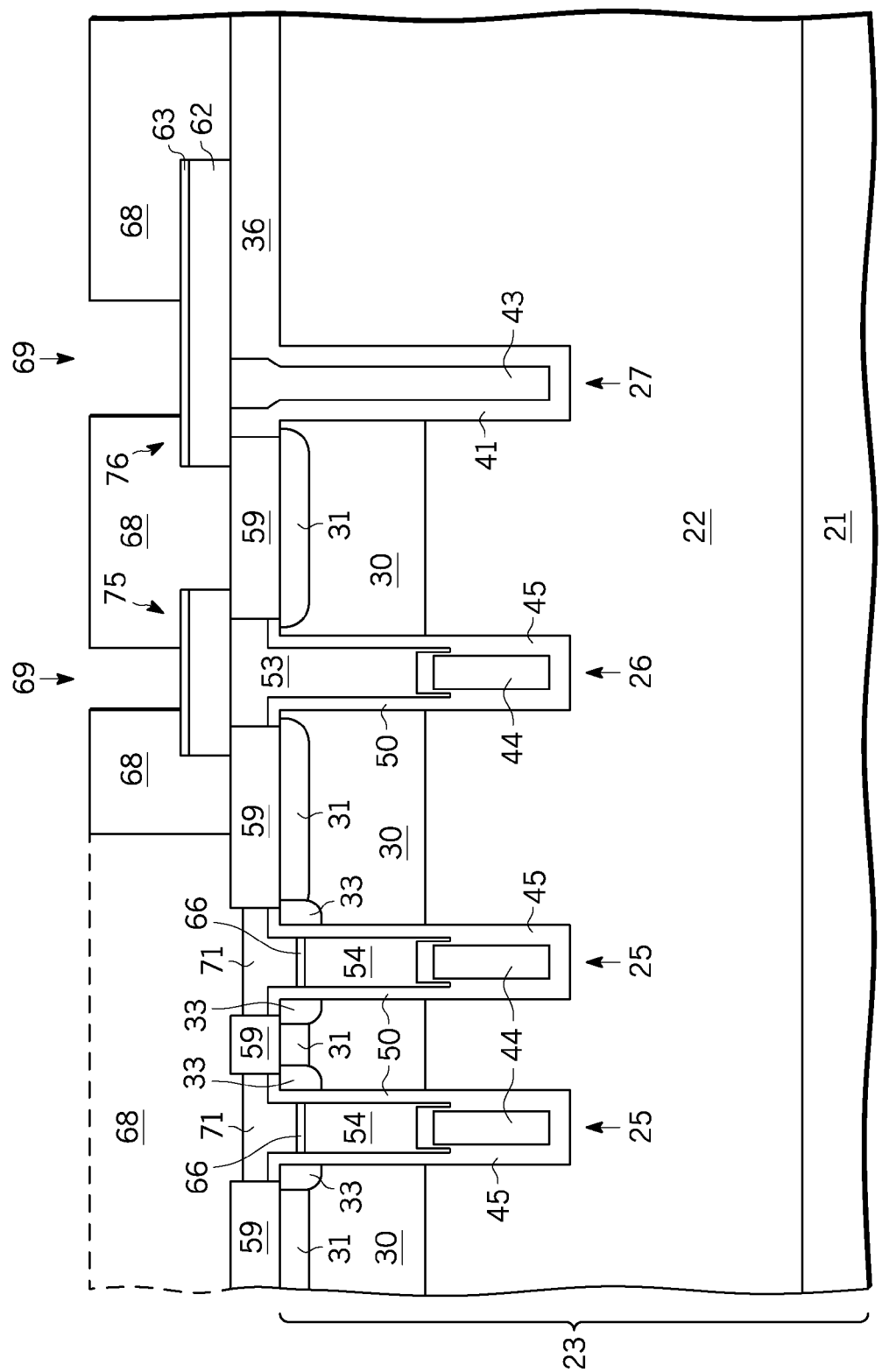

Referring to FIG. 11, a dielectric layer 68 (illustrated by dashed lines) is formed to cover regions 28 and 29. Layer 68 is then planarized to form a planar surface and facilitate subsequent operations. In the preferred embodiment, layer 68 is a layer of silicon dioxide that is planarized using a CMP operation. Alternately, layer 68 may be BPSG that is reflowed in order to planarize it or may be other dielectric materials that may be planarized by other planarization techniques.

Dielectric layer 68 is patterned to form openings that expose portions of conductors 75 and 76 and also expose the surface within active region 28. A portion of layer 68 is left to cover a portion of selective etch portions 59 that are between trench 26 and trenches 25. The region of layer 68 overlying active region 28 are then etched to reduce the thickness of layer 68 that are within region 28 to a value that is less than the thickness of portions 59. As can be seen, this removes layer 68 from the surface of portions 59 within region 28 but leaves a portion of layer 68 as an insulator 71 on conductor 54 (or on silicide region 66 of conductor 54). Thus, the top of insulator 71 is recessed below the surface of portions 59. Insulator 71 preferably extends above the surface of substrate 23 and at least is substantially parallel to the surface of substrate 23. Forming conductors 75 and 76 adjacent to each other instead overlying each other facilitates forming layer 68 thinner than it would have to be if conductors 75 and 76 were overlying each other. The thinner configuration of layer 68 allows more accurately controlling the removal of layer 68 during the step of forming insulator 71 which facilitates forming the top surface of insulator 71 below the top surface of portions 59.

If conductors 75 and 76 were overlying each other in a stacked configuration, the insulator overlying the conductors would have to be thicker than layer 68. The process used to remove the thicker insulator to expose the conductors has variability. The thicker the insulator, the more difficult it is to determine when to stop the removal process. The variability makes it difficult to remove portions of the thicker insulator while still leaving a portion of the insulator on conductors 54 and extending above the surface of substrate 23. Such a process for the thick insulator could damage the surface of substrate 23. Layer 68 that is illustrated on FIG. 11 generally is about thirty to fifty percent (30-50%) thinner than the thick insulator used for the overlying configuration of the conductors.

Figure 12:
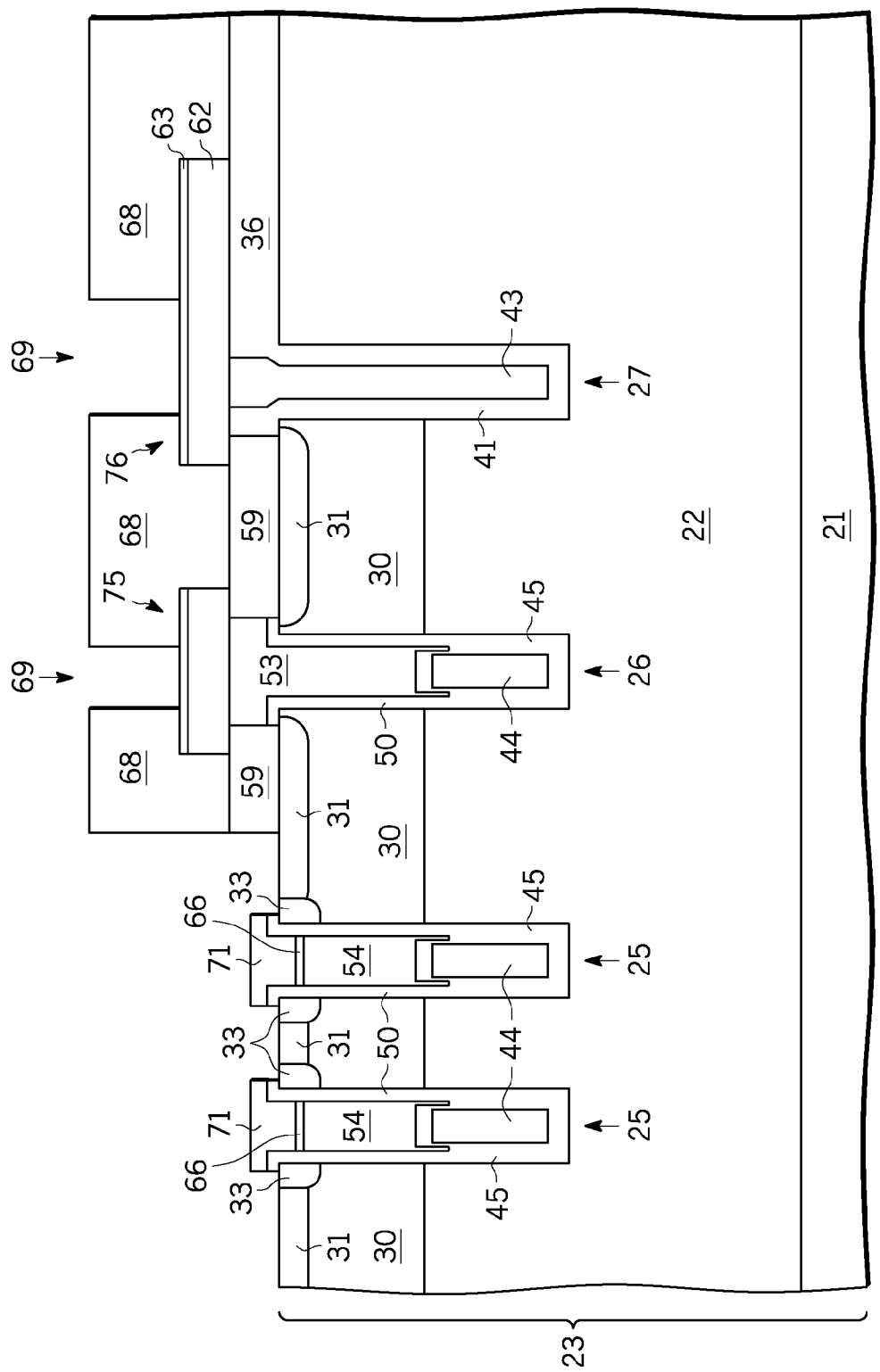

Referring to FIG. 12, in subsequent processing operations selective etch portions 59 are removed from the surface of substrate 23 within active region 28. This exposes regions 31 and 33 to facilitate subsequently forming electrical contact thereto. The remaining portions of layer 68 and insulator 71 are utilized as a mask during this operation. Subsequently, a thinning operation is used remove a portion of the exposed portions of insulators 50 and 71 in order to pull back the sides of insulators 50 and 71. The thinning operation also removes a portion of the exposed sides of insulators 50 and 71 so that the width of gate insulator 50 that extends along the surface of substrate 23 is reduced while the thickness of insulator 71 is reduced. Preferably, a wet etching operation is utilized to perform this step of the method.

Referring again to FIG. 2, trenches 25 preferably are formed as a plurality of stripes extending substantially parallel to each other across the surface of substrate 23. Plurality of trenches 26 and 27 are formed at each end of trenches 25. Forming electrical contact to conductors 44 and 54 at both ends of the stripes, reduces the resistance of gate conductors 54 and shield conductors 44 thereby improving the switching speed.

When the openings are formed in substrate 23 for trenches 25, 26, and 27, the opening for trenches 25 is extended to form a portion that is perpendicular to the long axis of each of trenches 25 as illustrated by a dashed line 40. This extended portion of trenches 25 and 26 has a structure that is similar to trench 25 (FIG. 1). As shield conductors 44 are formed in trenches 25, they are also formed in the portion of the opening illustrated by dashed lines 40. As a result, shield conductors 44 within trenches 25 also extend perpendicular to trenches 25 within the opening illustrated by dashed lines 40 as a shield inter-conductor. This shield inter-conductor interconnects all shield conductors 44 together thereby reducing the resistance of the shield conductors. The shield inter-conductor also connects conductors 44 to conductor 43. Similarly, as gate conductors 54 and insulators 45 and 50 are formed in trenches 25, insulators 45 and 50 in addition to gate conductors 54 also extend perpendicular to trenches 25 within the opening illustrated by dashed lines 40. This extension of gate conductors 54 forms a gate inter-conductor that interconnects all gate conductors 54 together thereby reducing the resistivity of the gate conductors. Additionally, the openings for trenches 26 extend to intersect the opening illustrated by dashed lines 40. Thus, the gate inter-conductor and shield inter-conductor within the opening illustrated by dashed lines 40 also intersect with and are electrically connected to respective gate conductor 53 and shield conductor 44 that are within trenches 26. Furthermore, the opening in substrate 23 for forming trenches 27 also extends, as illustrated by dashed lines 32, to intersect the opening illustrated by dashed lines 40. Consequently, the shield inter-conductor intersects with and is electrically connected to conductor 43 that is within each of trenches 27.

Conductors 75 and 76 are formed to extend laterally in termination region 29 (see dashed lines illustrating conductors 75 and 76) overlying the surface of substrate 23. The extended portions of conductors 75 and 76 facilitate forming an electrical connection between a package terminal or other element and conductors 75 and 76.

Referring again to FIG. 1, a conductor, such as a metal, is applied and patterned to form various electrodes such as source electrode 72 that electrically contacts both the source regions of doped regions 33 and the body contacts of doped regions 31, a gate electrode 73, and a shield electrode 74. Gate electrode 73 electrically contacts conductor 75 thereby forming an electrical connection to conductor 53. Since conductor 53 electrically contacts gate conductors 54 through the gate inter-connector (FIG. 2), electrode 73 forms an electrical connection to the gates of transistor 20. Shield electrode 74 electrically contacts conductor 76 thereby forming an electrical connection to conductor 43. Since conductor 43 forms an electrical connection to shield conductors 44 through the shield inter-connector, electrode 74 forms an electrical connection to the shields of transistor 20. Conductor 74 usually is electrically connected to conductor 72 at a point that is not shown in FIG. 1 and FIG. 2. Because conductors 75 and 76 are substantially coplanar and the heights of the other steps are small, damascene copper may be used for electrodes 72-74.

Figure 13:
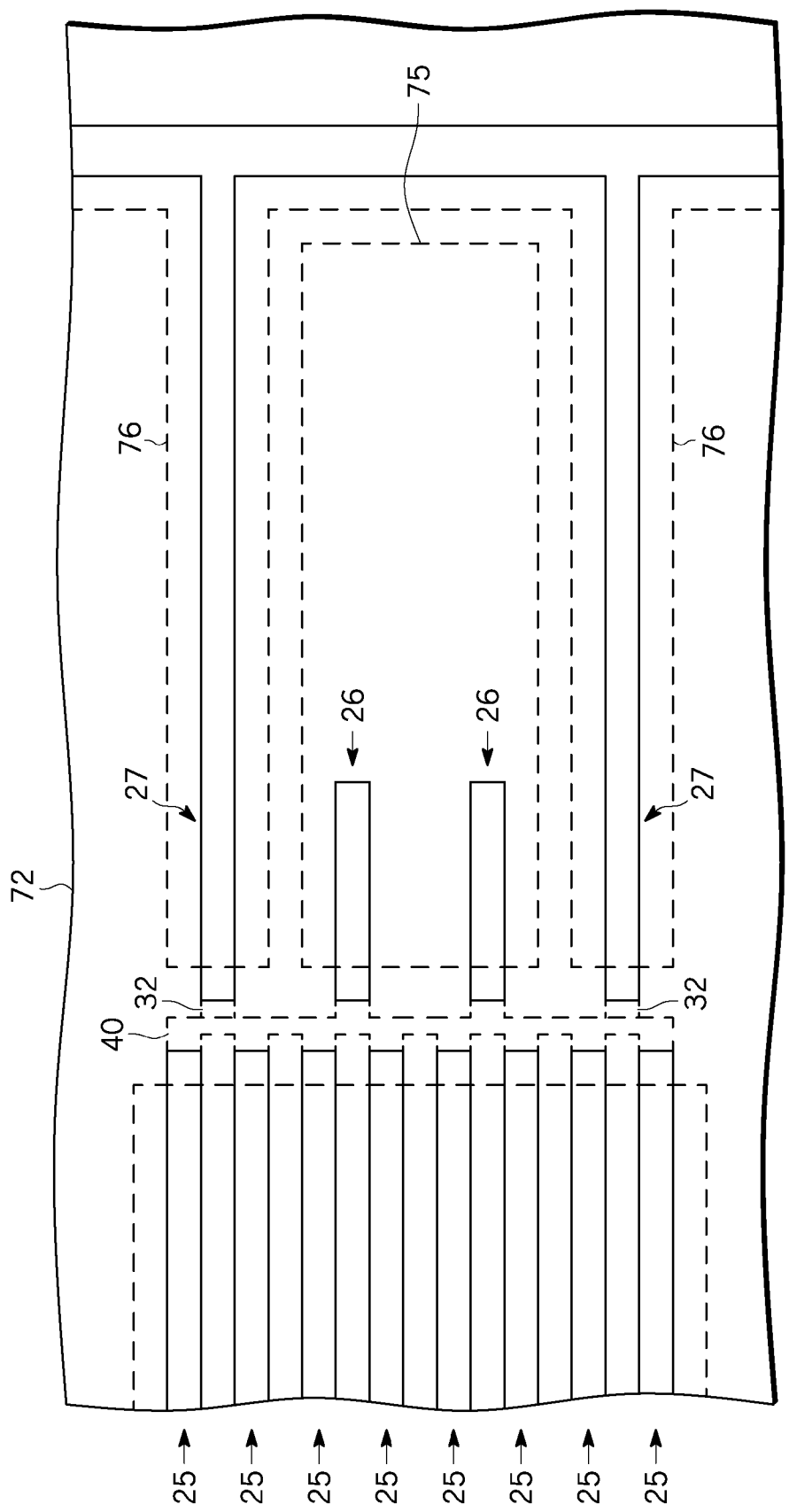
FIG. 13 illustrates an enlarged plan view of a portion of another embodiment of the transistor of FIG. 1 and FIG. 2 in accordance with the present invention.

FIG. 13 illustrates an enlarged plan view of a portion of an embodiment of transistor 20 that is an alternate embodiment to the embodiment illustrated in FIG. 2. The embodiment illustrated in FIG. 13 is similar to the embodiment illustrated in FIG. 2 but in FIG. 13 trench 27 and conductor 76 are extended to enclose the outer perimeter of transistor 20 and also trenches 26 on at least three sides. Because insulator 41 is thicker than insulator 50, extending trench 27 to surround the outer perimeter of transistor 20 and at least two or more sides of trenches 26 further reduces the electric fields in termination region 29 and improves the breakdown voltage of transistor 20.

Figure 14:
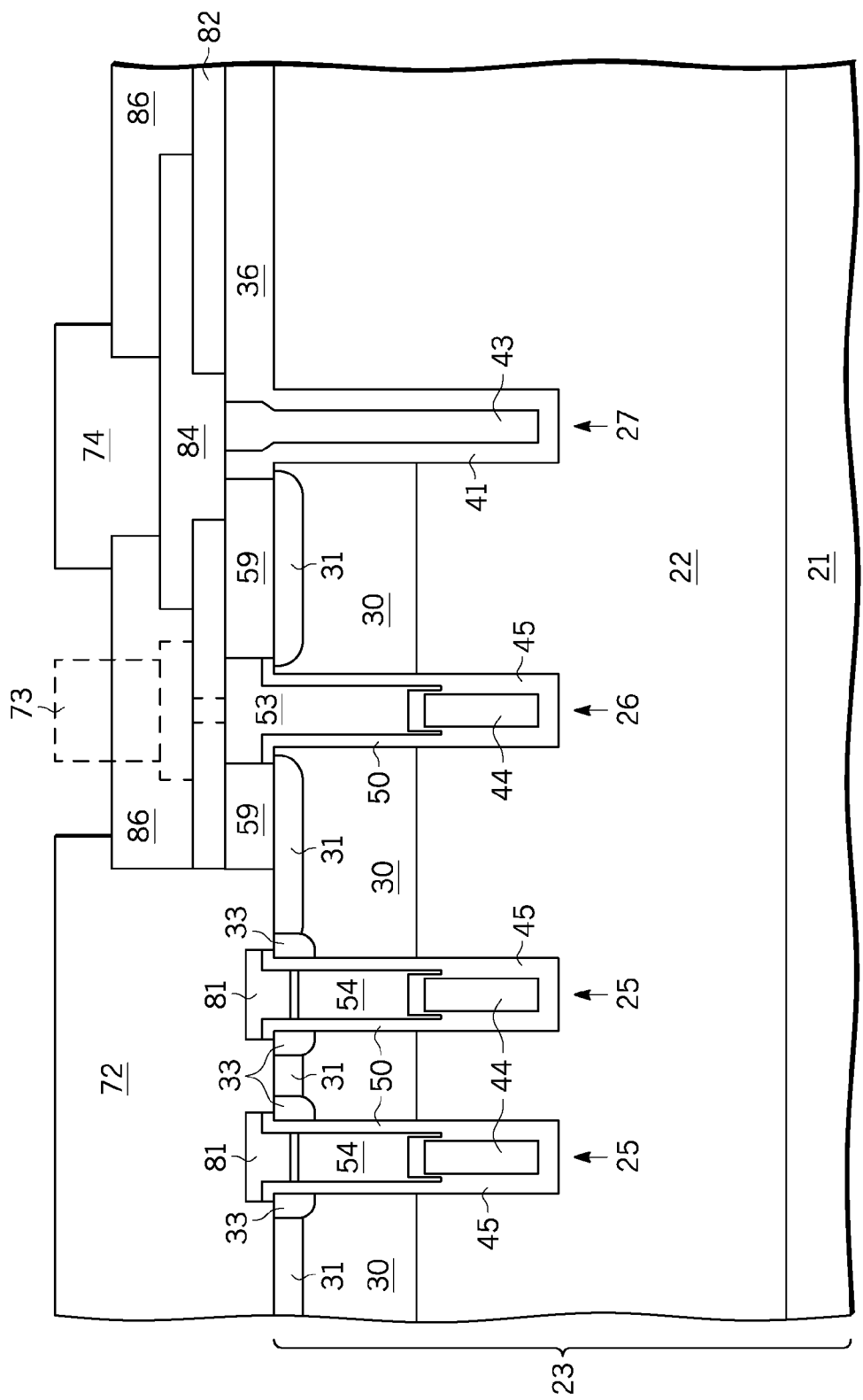
FIG. 14 illustrates an enlarged cross-sectional portion of an embodiment of another MOS transistor that is an alternate embodiment of the transistor of FIG. 1 in accordance with the present invention.

FIG. 14 illustrates an enlarged cross-sectional portion of an embodiment of an MOS transistor 120 that is an alternate embodiment of transistor 20 that was explained in the description of FIGS. 1-13. Transistor 120 is similar to transistor 20 but is formed using an embodiment of an alternate method of forming transistor 120.

FIG. 15-FIG. 18 illustrate various stages in the alternate method of forming transistor 120. The formation of transistor 120 generally is the same as the formation of transistor 20 up through the steps described through FIG. 8.

Figure 15:
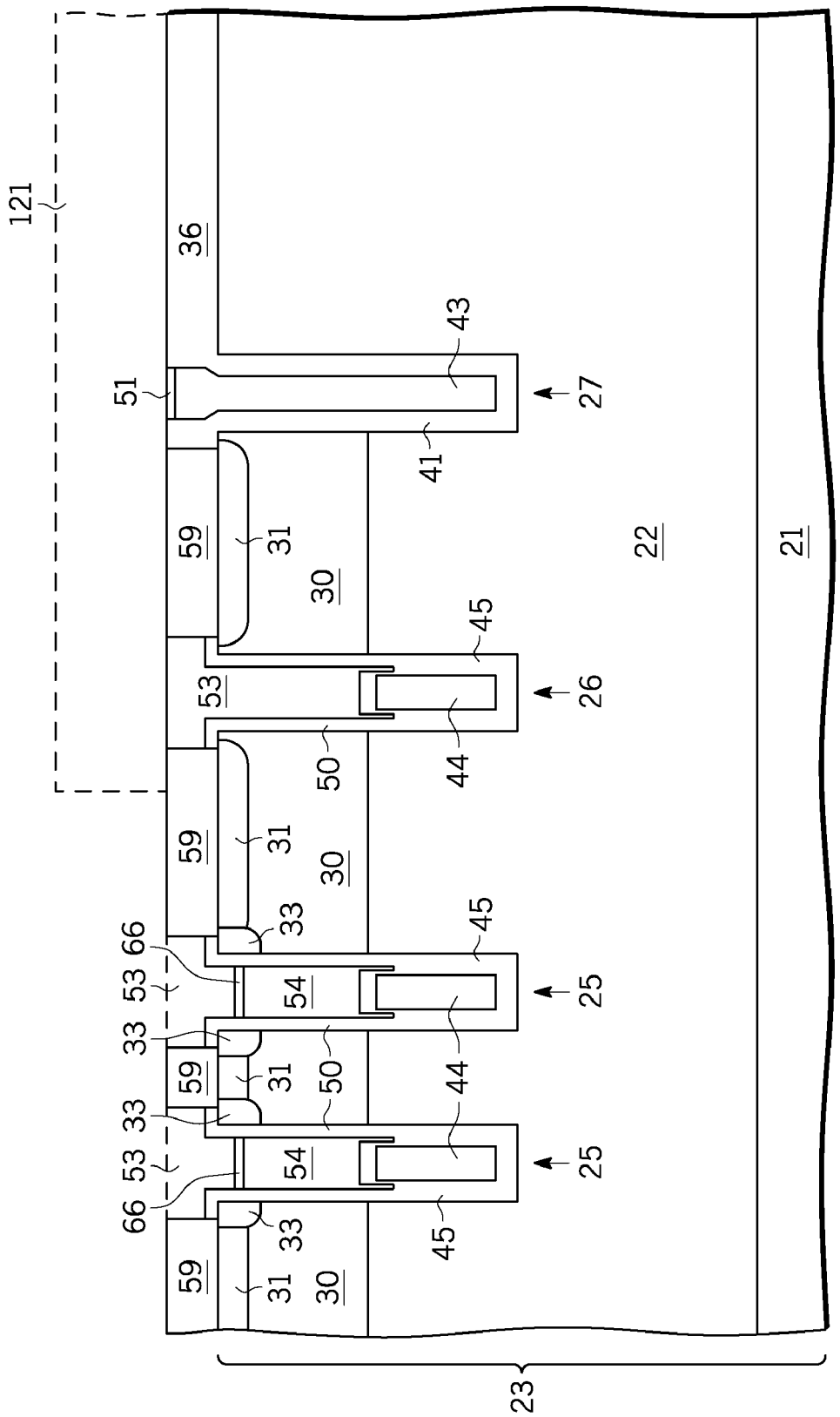
FIG. 15-FIG. 18 illustrate enlarged cross-sectional portions of the transistor of FIG. 14 illustrating various stages according to an embodiment of one method of forming the transistor of FIG. 14 in accordance with the present invention.

Referring to FIG. 15, subsequent to the operations described relating to FIG. 8, a mask 121 is applied and patterned to expose active region 28 and protect trenches 26 and 27 and the conductor materials therein. The exposed portion of conductor 53 in trenches 25 is etched using an operation that is selective to the material used for conductor 53 over the material of portions 59. The exposed portions of conductor 53 that extend above the surface of substrate 23 are removed and further portions of conductor 53 are removed (as illustrated by dashed lines) so that the top surface of the remaining portion of conductor 53 is below the top surface of substrate 23. This operation generally exposes the upper surface of insulator 50 that was formed on the surface of substrate 23. The portion of conductors 53 that remains within trenches 25 forms gate conductors 54. In the preferred embodiment, conductor 53 is doped polysilicon and selective etch portions 59 are silicon nitride, thus, a dry etch can be utilized to remove the portions of conductor 53 without affecting portions 59 or portions of transistor 20 underlying portions 59.

Thereafter, selective etch portions 59 are utilized as a mask for forming doped regions 33 on the surface of substrate 23 and overlapping regions 31 as the source regions of transistor 120. Using portions 59 as a mask forms regions 33 self-aligned to the gate structure formed by trenches 25. Mask 121 is removed and regions 33 generally are annealed to activate the dopants.

In the preferred embodiment, gate conductors 54 are polysilicon. The exposed top portions of this preferred embodiment of conductors 54 may be silicided in order to decrease the resistivity. The silicided portions of conductors 54 are illustrated as silicide regions 66.

Figure 16:
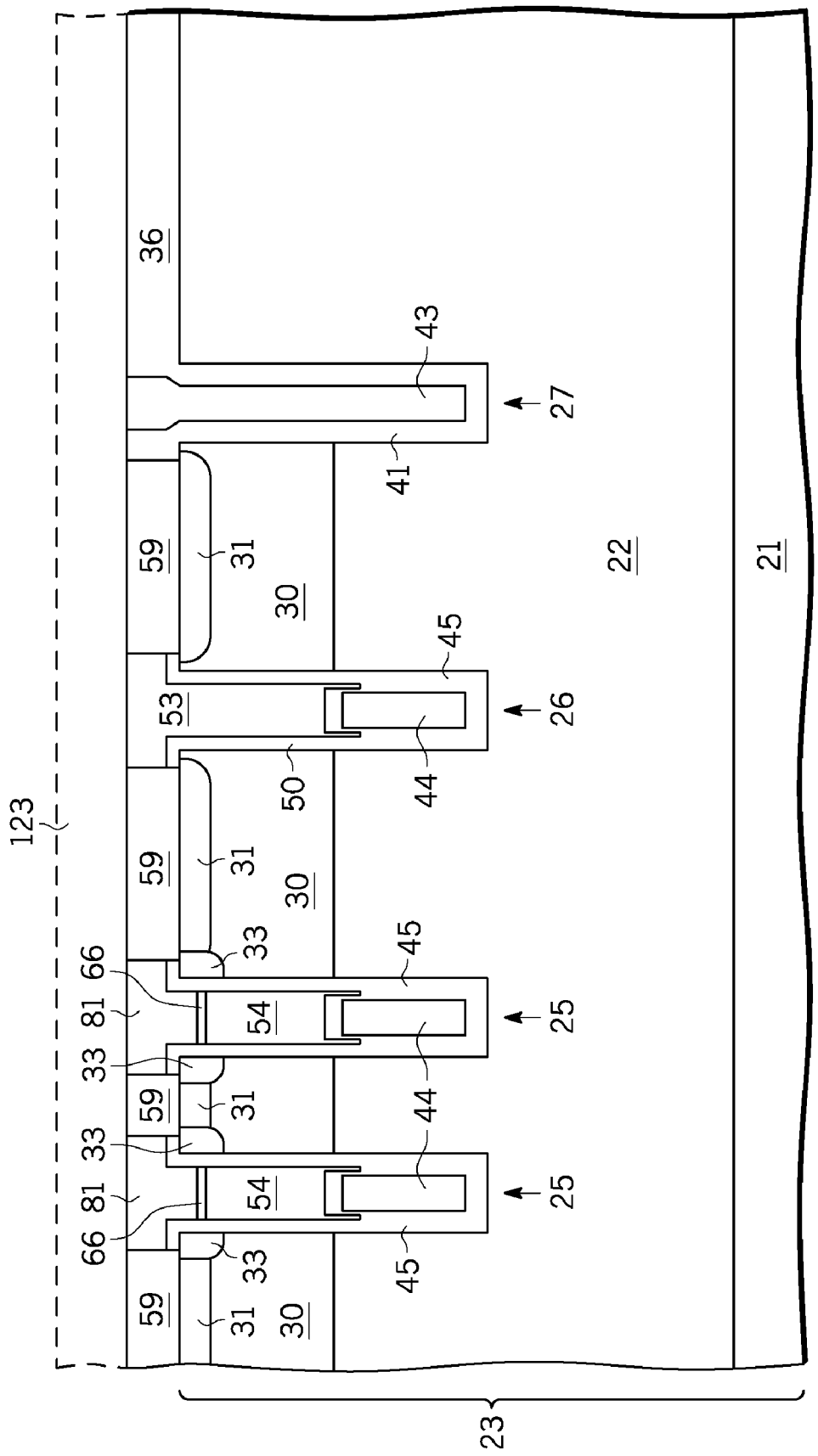

Referring to FIG. 16, a dielectric layer 123 is formed to cover regions 28 and 29. Layer 123 is then planarized to form a planar surface and facilitate subsequent operations. The planarization leaves portions of layer 123 within trenches 25 as an insulator 81 that is similar to insulator 71 of transistor 20. The planarization also removes the portion of insulator 51 that was on conductor 43. In the preferred embodiment, layer 123 is a layer of silicon dioxide that is planarized using a CMP operation. Alternately, layer 123 may be BPSG that is reflowed in order to planarize it or may be other dielectric materials that may be planarized by other planarization techniques.

Figure 17:
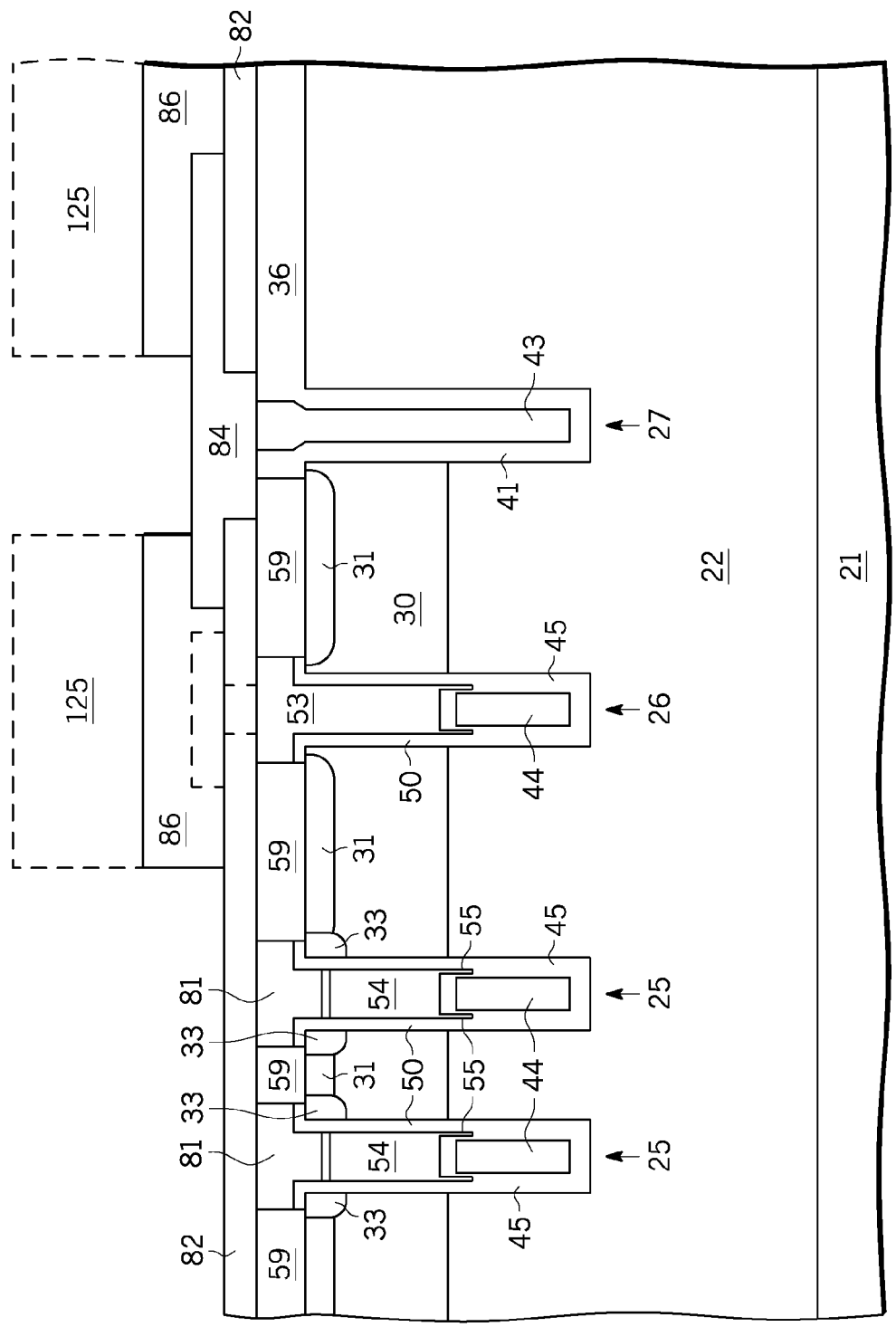

Referring to FIG. 17, a dielectric layer 82, such as silicon nitride, is subsequently formed on the planarized surface that includes portions 59 and oxide 36. Layer 82 is patterned to form an opening overlying conductor 43 of trench 27. Another opening or second opening is formed through layer 82 and overlying conductor 53 of trench 26. This second opening overlying conductor 53 preferably is formed over only a portion of conductor 53 so that conductor 84 may be extended across a portion of layer 82 where the second openings are not formed. Consequently, this second opening is illustrated as a dashed line. A conductor material is applied on layer 82 to form electrical contact with conductors 43 and 53. The conductor material is patterned to form conductor 84 on layer 82. Conductor 84 forms electrical contact to conductor 43. The conductor material may also be patterned to form another conductor or second conductor to electrically contact conductor 53, as illustrated by dashed lines.

A dielectric layer 86 is subsequently formed on layer 82 and conductor 84 to cover regions 28 and 29. Layer 86 is then planarized to form a planar surface to facilitate subsequent operations. The material used for layer 86 is a material than can be etched without significantly affecting the material used from layer 82. In the preferred embodiment, layer 86 is a layer of silicon dioxide that is planarized using a CMP operation and layer 82 is silicon nitride. A mask 125 is applied to cover region 29 and at least a portion of portions 59 that is between trenches 25 and 26. Layer 86 is patterned to form an opening that exposes conductor 84. The patterning of layer 86 also exposes the second conductor that is illustrated in dashed lines. Layer 82 forms an etch stop during this step of forming the openings.

Figure 18:
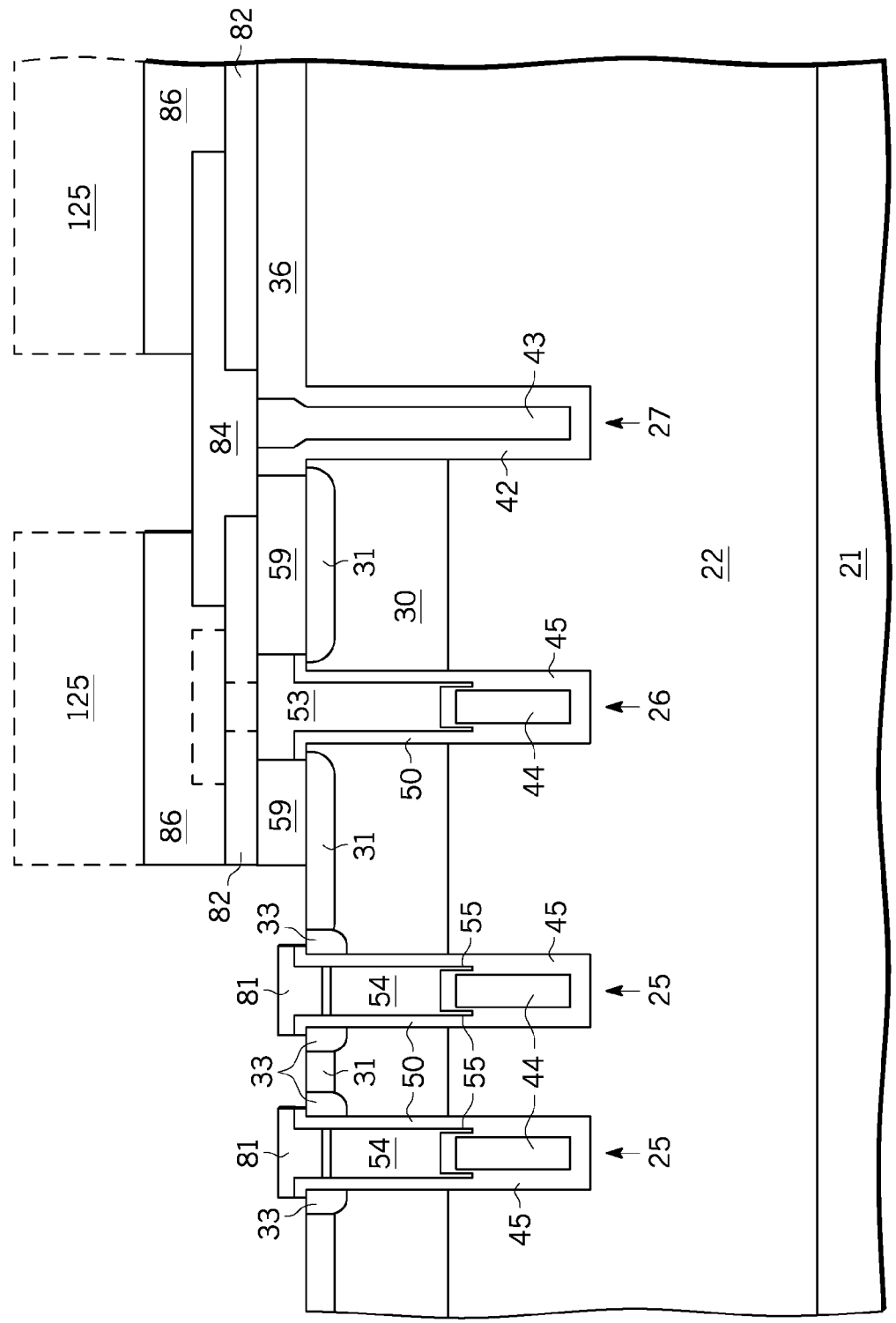

Referring to FIG. 18, the exposed portions of layer 82 are removed along with underlying portions 59. This exposes regions 31 and 33 to facilitate forming electrical connections thereto. Generally, the operation used to remove layer 82 and portions 59 selectively etches those materials verses the materials used for insulator 81.

Thereafter, the exposed portions of insulator 81 are thinned. The thinning operation also removes a portion of the exposed sides of insulators 81 and underlying insulator 50 so that the width of gate insulator 50 that extends along the surface of substrate 23 is reduced while the thickness and width of insulator 81 is reduced. Preferably, a wet etching operation is utilized to perform this thinning operation.

Referring back to FIG. 14, a conductor material is applied as a blanket layer and patterned to form source electrodes 72 and electrode 74. The conductor material is also patterned to form an electrode 73, as illustrated by dashed lines, to make electrical contact to conductor 53 and gate conductors 54.

Forming layer 82 overlying conductor 53 allows extending conductor 84 to overlie conductor 53 without making an electrical connection between conductors 53 and 84. Because layer 82 may be thin, the step height in termination region 29 remains low. Using layer 82 also provides more flexibility of the surface patterns that may be used for the conductors and to facilitate providing isolation between conductor 84 and conductor 53 so that conductor 84 may extend laterally across portions of dielectric 82 and cross over portions of conductor 53.

In view of all of the above, it is evident that a novel device and method is disclosed. Included, among other features, is forming a an MOS transistor to have two conductors that are electrically isolated from each other but are formed to be substantially planar to each other in a termination region of the transistor. Forming the two conductors to be substantially planar to each other allows the surface in the termination region to be formed more planar that prior termination regions thereby lowering the manufacturing costs. This configuration facilitates using CMP and other planarization operation without damaging corners where the two conductors would otherwise overlap. The planarity facilitates the use of CMP to fill the trenches with the conductor material instead of having to use etch back techniques to planarize the layers.

This provides better control of the steps in the method. The steps that are formed have a small differential between the different heights of the layers which facilities using damascene copper for the electrodes such as electrodes 72-74. Forming the gate electrode to make electrical contact to the gate conductors through the gate contact trench in the termination region reduces the amount of interconnect within the active region and allows the active trenches to be placed closer together thereby improving packing density and lowering the manufacturing costs. The method also facilitates self-aligning the body region, source regions, and the contacts relative to the outer sidewalls of the trenches that provide the gate structures of the transistor.

While the subject matter of the invention is described with specific preferred embodiments, it is evident that many alternatives and variations will be apparent to those skilled in the semiconductor arts. For example More specifically the subject matter of the invention has been described for a particular N-channel MOS transistor structure on a silicon substrate, although the method is directly applicable to other MOS transistors formed on other semiconductor materials, as well as to BiCMOS, metal semiconductor FETs (MESFETs), HFETs, IGBTs, and other transistor structures.

The invention claimed is:

1. A method of forming an MOS transistor comprising:
   providing a semiconductor substrate;
   forming the MOS transistor on the semiconductor substrate including forming the MOS transistor with an active region and a termination region that is external to the active region;
   forming an active trench in the active region;
   forming a first trench and a second trench within the termination region;
   forming a first conductor within the termination region and overlying the first trench wherein the first conductor is electrically connected to a second conductor within the first trench; and
   forming the second conductor to electrically contact a third conductor that is within the active trench.

2. The method of claim 1 further including forming a fourth conductor in the termination region and overlying the second trench wherein the fourth conductor is electrically connected to a fifth conductor within, the second trench.

3. The method of claim 2 further including forming the fifth conductor electrically connected to a sixth conductor that is in the active trench.

4. The method of claim 2 wherein forming the fourth conductor includes forming the fourth conductor and the first conductor to be substantially coplanar wherein both the fourth conductor and the first conductor are overlying a surface of the semiconductor substrate.

5. The method of claim 2 wherein forming the fourth conductor includes forming the fourth conductor and the first conductor to be inter-digitated.

6. The method of claim 2 further including forming the second conductor electrically connected to a sixth conductor that is formed within the second trench.

7. A method of forming a transistor comprising:
   providing a semiconductor substrate having a surface;
   forming a plurality first trenches in an active region of the transistor;
   forming a second trench and a third trench extending into the semiconductor substrate including forming the second trench and the third trench in a termination region of the transistor that is not in the active region of the transistor;
   forming a first conductor within the second trench;
   forming a second conductor within the third trench;
   forming a third conductor overlying the surface of the semiconductor substrate and overlying the second trench and electrically contacting the first conductor; and
   forming the first conductor electrically connected to a fourth conductor within at least one trench of the plurality of first trenches.

8. The method of claim 7 wherein forming the second trench and the third trench extending into the semiconductor substrate includes forming a dielectric layer on the surface of the semiconductor substrate and forming the second trench and the third trench extending through the dielectric layer and into the semiconductor substrate.

9. The method of claim 8 wherein forming the dielectric layer on the surface of the semiconductor substrate includes forming the dielectric layer in the termination region but not in the active region.

10. The method of claim 7 further including forming a fifth conductor overlying the surface of the semiconductor substrate and overlying the third trench and electrically contacting the second conductor but not the first conductor.

11. The method of claim 10 wherein forming the fifth conductor includes forming the fifth conductor substantially coplanar with the third conductor.

12. The method of claim 11 wherein forming the second trench and the third trench extending into the semiconductor substrate includes forming a dielectric layer on the surface of the semiconductor substrate and forming the second trench and the third trench extending through the dielectric layer and into the semiconductor substrate and further including forming the third conductor and the fifth conductor on the dielectric layer.

13. The method of claim 1 further including forming the second trench within the termination region positioned near the first trench and the active trench including forming a third conductor within the second trench wherein no source region is adjacent to the second trench.

14. The method of claim 7 wherein forming the third trench includes forming the third trench near the first trench wherein no source region is adjacent to the third trench.

15. The method of claim 7 wherein forming the plurality of first trenches includes forming the one trench of the plurality of first trenches to include a fifth conductor overlying the fourth conductor and electrically insulated from the fourth conductor.

\* \* \* \* \*